US012208699B2

United States Patent
Wehowski

(10) Patent No.: US 12,208,699 B2
(45) Date of Patent: Jan. 28, 2025

(54) HEAT EXCHANGER FOR COOLING AN INDUCTIVE CHARGING DEVICE AND INDUCTIVE CHARGING DEVICE

(71) Applicant: MAHLE International GmbH, Stuttgart (DE)

(72) Inventor: Manuel Wehowski, Bietigheim-Bissingen (DE)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 18/017,395

(22) PCT Filed: Jul. 19, 2021

(86) PCT No.: PCT/EP2021/070151
§ 371 (c)(1),
(2) Date: Jan. 20, 2023

(87) PCT Pub. No.: WO2022/018027
PCT Pub. Date: Jan. 27, 2022

(65) Prior Publication Data
US 2024/0367533 A1    Nov. 7, 2024

(30) Foreign Application Priority Data

Jul. 21, 2020    (DE) .................... 10 2020 209 125.0

(51) Int. Cl.
*B60L 53/302*    (2019.01)
*B60L 53/12*    (2019.01)
(Continued)

(52) U.S. Cl.
CPC ............ *B60L 53/302* (2019.02); *B60L 53/12* (2019.02); *H01F 27/10* (2013.01); *H02J 50/10* (2016.02); *H05K 7/209* (2013.01)

(58) Field of Classification Search
CPC ........ B60L 53/302; B60L 53/12; H01F 27/10; H02J 50/10; H05K 7/209
See application file for complete search history.

(56) References Cited

U.S. PATENT DOCUMENTS 10,655,922 B2 *    5/2020   Bungo ................. H01L 23/473
11,552,502 B2 *    1/2023   Laemmle ............. H02J 50/10
(Continued)

FOREIGN PATENT DOCUMENTS

CN    201898434 U    7/2011
CN    103096690 A    5/2013
(Continued)

OTHER PUBLICATIONS

English abstract for CN-201 898 434.
(Continued)

*Primary Examiner* — Jared Fureman
*Assistant Examiner* — Michael J Warmflash
(74) *Attorney, Agent, or Firm* — Fishman Stewart PLLC

(57) ABSTRACT

A heat exchanger for an inductive charging device of a motor vehicle may include two separate bases and a flow conducting assembly. The two bases may be connected permanently to one another to form a one-piece heat exchanger housing and a flow channel through which a flow path for a heat exchanger fluid extends. The flow channel may have, along the flow path, a plurality of channel passages through which the heat exchanger fluid is flowable in succession. The plurality of channel passages may each have a free flow cross-section oriented transversely to the flow path. The flow cross-section of a plurality of first channel passages may be flatter than the flow cross-section of a plurality of second channel passages. The flow con-
(Continued)

ducting assembly may be inserted completely into the flow channel. The two bases may be composed of a metallic material.

17 Claims, 4 Drawing Sheets

(51) Int. Cl.
*H01F 27/10* (2006.01)
*H02J 50/10* (2016.01)
*H05K 7/20* (2006.01)

(56) References Cited

U.S. PATENT DOCUMENTS

| | | | | |
|---|---|---|---|---|
| 2007/0261833 | A1* | 11/2007 | Yang | F28F 3/046 |
| | | | | 165/178 |
| 2013/0112388 | A1* | 5/2013 | Kwak | H01L 23/473 |
| | | | | 165/185 |
| 2017/0253129 | A1* | 9/2017 | Garcia | H01F 27/10 |
| 2017/0338023 | A1* | 11/2017 | Ansari | H01F 27/363 |
| 2018/0374624 | A1* | 12/2018 | Yuasa | H01F 27/08 |
| 2019/0168624 | A1* | 6/2019 | Peer | H01F 27/2804 |
| 2019/0360764 | A1* | 11/2019 | Liu | F28F 3/06 |
| 2020/0027640 | A1* | 1/2020 | Laemmle | H02J 50/10 |

FOREIGN PATENT DOCUMENTS

| | | |
|---|---|---|
| CN | 106715187 A | 5/2017 |
| CN | 107404824 A | 11/2017 |
| CN | 109103973 A | 12/2018 |
| CN | 110461640 A | 11/2019 |
| CN | 110543069 A | 12/2019 |
| DE | 202007017501 U1 | 4/2009 |
| DE | 102016215285 A1 | 2/2018 |
| DE | 102018203557 A1 | 9/2019 |
| EP | 3419031 A1 | 12/2018 |

OTHER PUBLICATIONS

Chinese Search report Jul. 4, 2023 for Chinese App. No. 202180061586.0 (w_translation).
Chinese Office Action Jul. 8, 2023 for Chinese App. No. 202180061586.0 (w_translation).

* cited by examiner

HEAT EXCHANGER FOR COOLING AN INDUCTIVE CHARGING DEVICE AND INDUCTIVE CHARGING DEVICE

CROSS-REFERENCE TO RELATED APPLICATIONS

This application claims priority to International Patent Application No. PCT/EP2021/070151, filed on Jul. 19, 2021, and German Patent Application No. DE 10 2020 209 125.0, filed on Jul. 21, 2020, the contents of both of which are hereby incorporated by reference in their entirety.

TECHNICAL FIELD

The invention relates to a heat exchanger for cooling an inductive charging device and further relates to an inductive charging device on board a motor vehicle.

BACKGROUND

Generic heating exchangers are described for example in US 2019/360764 A1 and US 2013/112388 A1. Furthermore, generic inductive charging devices are known for example from US 2017/338023 A1, US 2017/253129 A1 and EP 3 419 031 A1.

SUMMARY

The invention has set as its object to provide an improved heat exchanger or at least to provide a different embodiment for a heat exchanger for cooling an inductive charging device. In particular, the invention has given itself the object of equipping an inductive charging device with a cooling element.

In the present invention, this problem is solved in particular by the subjects of the independent claim(s). Advantageous embodiments are the subject matter of the dependent claim(s) and the description.

The basic idea of the invention lies in providing a heat exchanger which is relatively efficient with regard to cooling and is relatively compact, for cooling an inductive charging device of a motor vehicle.

For this, according to the invention a heat exchanger is provided for cooling an inductive charging device of a motor vehicle, which has two separate metallic bases which are connected, in particular soldered, to one another. These bases form or delimit a planar, one-piece heat exchanger housing and a flow channel through which a flow path for a heat exchanger fluid extends. The flow channel has, in turn, separate channel passages, able to be flowed through by heat exchanger fluid along the flow path, which channel passages open out expediently respectively downstream and upstream into a channel passage delegated immediately adjacently in the direction of the flow path. These channel passages have respectively a free, in particular constant or variable, flow cross-section oriented transversely to the flow path, wherein the flow cross-sections of so-called first channel passages of these channel passages are designed to be flatter than the flow cross-sections of so-called second channel passages of these channel passages. The said flow channel thus has expediently at least two different types of channel passages. In order to provide within the flow channel in particular a favourable flow pattern, for example a turbulent flow, the heat exchanger has a flow conducting assembly inserted entirely into the flow channel and able to be flowed through by the heat exchanger fluid, for conducting the heat exchanger fluid.

Expediently, the specialist in the art will interpret the term "flatter" in the sense that the one flow cross-sections have respectively a smaller cross-section than the respective other flow cross-sections. Thereby, the flow cross-sections of the channel passages are designed to be different in size with regard to area. Further expediently, the heat exchanger fluid volume which is conveyed through the flow channel per unit of time (in particular second), i.e. the volume flow of the heat exchanger fluid, is set in a constant manner or is able to be set by means of a suitable heat exchanger fluid conveying device of the heat exchanger. Expediently, the constant volume flow of the heat exchanger fluid and the different flow cross-sections of the channel passages of the flow channel bring about the fluidic effect that the heat exchanger fluid flows through the flow channel at different flow speeds, namely in particular dependent on the respective flow cross-section. For example, it will flow through the relatively wide second channel passages of relatively large flow cross-section at relatively low flow speed, whereas it flows through the relatively narrow first channel passages of relatively small cross-section at comparatively high speed. The different flow speeds of the heat exchanger fluid in the flow channel influence the heat transfer behaviour of the heat exchanger and/or expediently the heat flow which is able to be transferred between a heat source and the heat exchanger fluid. The invention has recognized that in the relatively narrow first channel passages of relatively small flow cross-section, flowed through comparatively at high flow speed, an improved heat transfer can take place, whereas in the relatively wide second channel passages of relatively large flow cross-section flowed through comparatively at low flow speed, a relatively small pressure loss—consequently optimum flow characteristics for the heat exchanger fluid—is able to be achieved. The flow conducting assembly according to the invention serves to improve the heat transfer between heat exchanger fluid and bases, and to equip the heat exchanger fluid with a predetermined or predeterminable flow pattern, for example a turbulent flow which is advantageous for heat transfer. Furthermore, the flow conducting assembly can improve the mechanical rigidity of the heat exchanger, for example the flow conducting assembly can reinforce the heat exchanger housing, whereby the latter is more resistant to external force loads. All these effects in combination have the shared advantage that the heat exchanger according to the invention is adapted or adaptable relatively well to a heat source and is able to be produced in a relatively compact manner.

Expediently, these advantageous characteristics of the heat exchanger according to the invention are used in inductive charging arrangements for motor vehicles, in order to provide for sufficient cooling in operation of the inductive charging arrangements. Inductive charging arrangements for motor vehicles in the sense of the present invention, consisting of an inductive charging device able to be installed on board a motor vehicle, so to speak the mobile component of an inductive charging arrangement, and of a mutual inductive device on the roadway or on the ground, which generally forms a stationary component of the inductive charging arrangement. The heat exchanger according to the invention can be structurally coordinated for example to predetermined regions of relatively high electromagnetic losses of the inductive charging device, in order to provide for optimum cooling there. It is also conceivable that the heat exchanger according to the invention can come into use at the mutual inductive device on the roadway.

Further expediently, the flow conducting assembly can have conducting elements which are separate and respectively configured in one piece. This concerns preferably several separate conducting elements, i.e. in particular separated entirely from one another, which serve for directing the heat exchanger fluid and for optimizing the heat conducting characteristics. The conducting elements are respectively configured in one piece, thereby they form respectively so to speak a cohesive structural unit. The conducting elements can be produced here if applicable in one piece in a one-part manner, for example from a single material, or in one piece in a multiple-part manner, for example from several different materials. The conducting elements can interact directly with the heat exchanger fluid in a flow-promoting manner.

Expediently, respectively a single conducting element can be inserted into each of the first channel passages of these channel passages or into each of the second channel passages of these channel passages or into each of the first and second channel passages of these channel passages. Thereby, either all the first channel passages or all the second channel passages or all the channel passages are equipped with conducting elements. This has the advantage that the heat transfer in these channel passages is improved. Furthermore, the rigidity of these channel passages is improved. In particular, provision can be made that in the first or second channel passages of these channel passages respectively more than one single conducting element is inserted.

Further expediently, the conducting elements are fixed on the one and/or the other base in a form-fit and/or force-fit in a heat-conducting manner. Preferably, the conducting elements can be fixed on the one and/or the other base by means of fastening screws. Further preferably, the conducting elements can be engaged securely on the one and/or the other base by means of detent elements. Expediently, the conducting elements are thus immobile with respect to the bases.

Expediently, the conducting elements are fixed respectively on the one and/or the other base in a materially bonded manner. Preferably, the conducting elements can be fixed respectively on one of the two bases by soldering. This can be assisted if applicable by the use of a suitable solder material. Further preferably, the conducting elements can be fixed respectively on one of the two bases by gluing. Expediently, the conducting elements are thus immobile with respect to the bases.

Further expediently, the conducting elements delimit or form respectively conducting channels aligned parallel to one another, which respectively define a channel longitudinal axis, whereby through these conducting channels respectively the flow path for the heat exchanger fluid extends, so that the conducting channels are respectively able to be flowed through by heat exchanger fluid. The heat exchanger fluid can be directed or respectively guided through the conducting channels. This has the advantage that the heat exchanger fluid is directed and the heat transfer is improved in this region.

Expediently, the conducting channels of a respective conducting element open at one end and at the other end into a first channel passage of these channel passages or into a second channel passage of these channel passages. Thereby, the heat exchanger fluid can flow, starting from the conducting channels, either into the first or into the second channel passages.

Further expediently, the conducting channels delimit or form a respective conducting element respectively a free conducting cross-section which is able to be flowed through, which is oriented transversely to the channel longitudinal axis and is constant with regard to area and is rectangular, four-cornered or polygonal.

Expediently, the conducting elements can be embodied respectively in a trapezoidal shape. In practice, it is recommended here to realize the respective conducting elements as identical parts, therefore to embody these respectively so as to be identical in construction. Expediently, the respective conducting elements can be produced here from an aluminium material. The term "aluminium material" can comprise here both pure aluminium material and also any aluminium alloys. Metallic conducting elements, in particular containing aluminium, can generate an electromagnetic shielding effect. In particular, the respective conducting elements can be produced from a corrugated or folded or pleated sheet metal material.

Further expediently, the said flow cross-sections of the first channel passages of these channel passages are identical in area to one another, therefore identical with regard to area size. The same can be envisaged for the flow cross-sections of the second channel passages of these channel passages, namely that these are identical in area to one another, therefore identical with regard to area size. Thereby, the flow channel has two different channel passage types which are clearly distinguishable. These channel passages can be produced relatively easily.

Expediently, the flow cross-sections of the first channel passages of these channel passages have or cover in terms of area respectively only $9/10$ or $8/10$ or $7/10$ or $6/10$ or $5/10$ or $4/10$ or $3/10$ or $2/10$ or $1/10$ of the area of the flow cross-section of a second channel passage of these channel passages. This has the advantageous effect that the flow speed of the heat exchanger fluid in the relatively narrow first channel passages of relatively small flow cross-section is relatively high. This leads to an improved transport of heat in the marginal regions of the ferrites, where also an increased waste heat arises.

Further expediently, the first channel passages of these channel passages and the second channel passages of these channel passages are consecutive along the flow path in alternating sequence in turn. Thereby for example a second channel passage always follows a first channel passage, or vice versa. It is expedient here to allow the one channel passage to open into the other, so that heat exchanger fluid can flow from the one into the next channel passage. The channel passages can thereby communicate fluidically with one another, so to speak. This enables as a whole a relatively good heat transfer behaviour of the heat exchanger with, at the same time, an optimized pressure loss.

It is furthermore expedient if the heat exchanger housing is embodied as an annular housing or as a polygonal housing. However—where it is appropriate-different further geometric housing shapes can also come into consideration. In these cases, the flow channel forms a planar ring channel, through which a likewise annular flow path for the heat exchanger fluid extends. In specialist circles, this can also be designated under the term "U flow". In particular, the flow path can extend in a circular shape or substantially circular shape, or u-shape, around a centrally arranged housing centre axis with respect to the annular channel, standing perpendicularly on the bases of the heat exchanger housing. The said heat exchanger housing can be divided into the respective channel passages in a cake-like manner, in particular the said channel passages can thereby have a cut-out shape corresponding to the respective heat exchanger housing. For example they are configured with a circle cut-out shape or polygon cut-out shape, so that together they can form the corresponding heat exchanger housing. Thereby, the heat exchanger as a whole can be embodied in a relatively compact manner, whereby for example the installation in a motor vehicle or in an inductive charging arrangement for a motor vehicle is promoted.

Further expediently, the heat exchanger can have two channel passages, which are formed by two connection pieces, fixed or arranged on the heat exchanger housing. Here, the one first connection piece forms a fluid inlet, and the other second connection piece forms a fluid outlet. By means of the fluid inlet, heat exchanger fluid can be streamed into the flow channel; by means of the fluid outlet, heat exchanger fluid can be streamed out from the flow channel. In particular, the fluid inlet and the fluid outlet can lie adjacent to one another and/or can open respectively into the second channel passage of these channel passages, so that heat exchanger fluid can stream so to speak into one of the relatively wide second channel passages of relatively large flow cross-section, or respectively can stream out via the latter. In particular, this second channel passage can be equipped with a conducting element. Expedient this one conducting element is coordinated to the fluid inlet and the fluid outlet, for example it can leave a region free around the fluid inlet and the fluid outlet, so that heat exchanger fluid can flow in in a manner favourable with regard to flow.

The invention can comprise the alternative or additional further basic idea of indicating an inductive charging device on board a motor vehicle, which is operable in an inductive charging arrangement serving for the charging of a traction battery of a motor vehicle. In particular, such an inductive charging device is to be equipped with a cooling element, in order to provide a predetermined cooling capacity and/or to cool the inductive charging device sufficiently, and to realize an optimized pressure loss of the heat exchanger fluid.

For this, an inductive charging device is provided, which is able to be mounted on board on a motor vehicle and is able to be used or respectively operated so to speak as a component part in an inductive charging arrangement for charging a traction battery of a motor vehicle. The inductive charging device according to the invention has a planar coil carrier able to be installed into a motor vehicle on the underbody, which coil carrier carries an electrically contacted or contactable coil, and which is reinforced for example with respect to mechanical loads from the exterior by a reinforcing arrangement of at least one reinforcing body. The said reinforcing bodies are respectively spaced apart with respect to one another, for example several millimetres to centimetres, longitudinally to an in particular planar carrier large area of the coil carrier with the formation of initially free intermediate regions, and are fixed on the coil carrier respectively resting on this carrier large area. Thereby, the reinforcing bodies can form separate structural parts so to speak, which subsequently—for example depending on stress—are joined to the coil carrier. In each of these said intermediate regions, a ferrite body of a ferrite arrangement, having several separate ferrite bodies, is inserted, the intermediate regions are therefore respectively expediently partially filled. Here, these ferrite bodies and these reinforcing bodies span a shared plane, which is arranged expediently parallel or substantially parallel to the carrier large area. The inductive charging device has, furthermore, an electronics arrangement of at least one electronics body. The electronics bodies can be, in particular, power electronics for the inductive charging device. In order to keep a heating of the inductive charging device, brought about in operation of the inductive charging device by power loss, in particular by electromagnetic losses and/or electrical resistance losses etc., in a predetermined operating window, the inductive charging device has at least one cooling element which serves for cooling the inductive charging device. It is expedient here if the cooling element is arranged relatively close to locations of relatively high losses, i.e. at locations with relatively high temperature load. For this, the cooling element is interposed in a sandwich-like manner in the direction of a transverse axis standing perpendicularly on the carrier large area between, on the one hand, the ferrite arrangement, the reinforcing arrangement and the coil carrier and, on the other hand, the electronics arrangement. The specialist in the art can understand the term "sandwich-like" here in the sense of a direct layer-like arrangement. Thereby it is achieved that, through the cooling element, the electronics arrangement is delimited with respect to the ferrite arrangement, the reinforcing element and the coil carrier, and electromagnetically shieldable or shielded and coolable. So that the said components remain together over the entire lifespan of the inductive charging device and are immobile relative to one another, the ferrite arrangement, the reinforcing arrangement, the coil carrier and the cooling element are respectively fixed to one another at least partially by a casting compound having heat-conducting properties; for example one can speak here in terms of a bonding. Thereby, an advantageous inductive charging device is described, which is distinguished by a relatively small overall height and by a cooling element with relatively high cooling capacity.

The described inductive charging device—as indicated above—is expediently arranged on board on the underbody of a motor vehicle and is a component part of a superordinate inductive charging arrangement. Such inductive charging arrangements for motor vehicles in the sense of the present invention consist respectively of the said induction device, able to be installed on board a motor vehicle, and of a mutual inductive device, able to be installed on the roadway. The corresponding specialist circles also know said inductive charging device under the term "vehicle assembly system" and said mutual inductive charging device under the term "ground assembly system". The inductive charging arrangements allow a traction battery of a motor vehicle to be charged in a contactless manner. Here, the mutual inductive charging device is coupled inductively with the coil of the inductive charging device in a known manner via a counter-coil, not explained more closely, and a pulsing magnetic field provided therewith. During the charging of the traction battery, heat losses occur at least within the inductive charging device, which cause a gradual heating of the inductive charging device. In order to provide a sufficient cooling, the cooling element is provided, which keeps the heating of the inductive charging device in predetermined permissible heating ranges. Expediently, the cooling element, in particular a heat exchanger according to the preceding description, can also be used successfully for cooling on a mutual inductive charging device.

Expediently, the said reinforcing bodies can also serve as positioning aids for the positioning of the ferrite bodies.

Further, provision is made that the said cooling element of the inductive charging device is a heat exchanger according to the preceding description. It is also possible that the cooling element has several heat exchangers according to the preceding description, for example in order to cool further components of the inductive charging device. In order to connect the said heat exchanger or expediently exchangers to the other components of the inductive charging device, a first base of the two bases of the heat exchanger is arranged, for example permanently fixed, on the ferrite arrangement, the reinforcing arrangement and the coil carrier by means of the said casting compound now entirely covering a base large area of the first base. The first base of the two bases has recesses here, in particular so-called recess portions, and base portions.

Alternatively, the other second base of the bases or the first and second base can have recesses, in particular so-called recess portions, and base portions. The said recesses could also be described as depressions, corrugations or groovings, which are introduced into the respective base of the heat exchanger with respect to the base portions. In the assembled state of the inductive charging device, these recesses expediently lie opposite the regions of relatively high electromagnetic losses, as are present e.g. in the marginal region of the ferrites. Shielding losses are reduced by the recesses, in particular by the increased distance.

Further expediently, the recesses and base portions can be arranged in the region of the base large area of the first base and can segment this large area. If applicable, the recesses and the base portions form the said base large area. The recesses and base portions are thus preferably arranged only in the region of the base large area which is covered with casting compound. The recesses can point expediently away from the coil carrier in the direction of the transverse axis, can be indented with respect to the base large area of the first base in the direction of the transverse axis away from the coil carrier and furthermore, respectively in the direction of the transverse axis, lie opposite a reinforcing body of the reinforcing arrangement. Thus, so to speak, precisely one reinforcing body is associated with each recess. The base portions can lie expediently respectively in the direction of the transverse axis opposite a ferrite body of the ferrite arrangement. The base portions lie expediently on the same height level as the base large area. Expediently, the base portions define the base large area. In any case, it is furthermore expedient if a first distance in the direction of the transverse axis between a respective recess and the said plane and/or a respective reinforcing body is greater than a second distance in the direction of the transverse axis between a respective base portion and the said plane and/or a respective ferrite body. Thus, between the recesses and the reinforcing bodies or respectively the plane, respectively a comparatively large (first) distance is formed; the latter can be filled with casting compound, which promotes heat-conducting properties and electromagnetic shieldings. On the other hand, the other (second) distance between the base portions and the ferrite bodies or respectively the plane is comparatively small, whereby in this region heat-conducting properties are promoted.

Expediently, the said recesses of the first base of the two bases, together with the second base of the two bases lying opposite in the direction of the transverse axis, can delimit or form the first channel passages of the heat exchanger. The said base portions of the first base of the two bases can delimit or form here, together with the second base of the two bases lying opposite in the direction of the transverse axis, the second channel passages of the channel passages of the heat exchanger. This has the advantageous effect that the regions of relatively high electromagnetic losses are able to be cooled relatively well.

Expediently, the coil carrier is a non-metallic coil carrier.

To sum up, it remains to be noted: The present invention preferably relates to a heat exchanger for an inductive charging device of a motor vehicle, with two bases that form a heat exchanger housing and a flow channel, through which a flow path for a heat exchanger fluid extends, wherein the flow channel has channel passages along the flow path, each channel passage having a flow cross-section oriented transversely to the flow path, wherein flow cross-sections of first channel passages of these channel passages are designed to be flatter than flow cross-sections of second channel passages of these channel passages, and with a flow conducting assembly, which is inserted into the flow channel, for conducting the heat exchanger fluid. The present invention relates to an inductive charging device comprising a cooling element.

Further important features and advantages of the invention will emerge from the subclaims, from the drawings and from the associated figure description with the aid of the drawings.

It shall be understood that the features mentioned above and to be explained further below are able to be used not only in the respectively indicated combination, but also in other combinations or in isolation, without departing from the scope of the present invention.

Preferred example embodiments of the invention are illustrated in the drawings and are explained more closely in the following description, wherein the same reference numbers refer to identical or similar or functionally identical components.

BRIEF DESCRIPTION OF THE DRAWINGS

There are shown, respectively schematically

DETAILED DESCRIPTION

Figure 1:
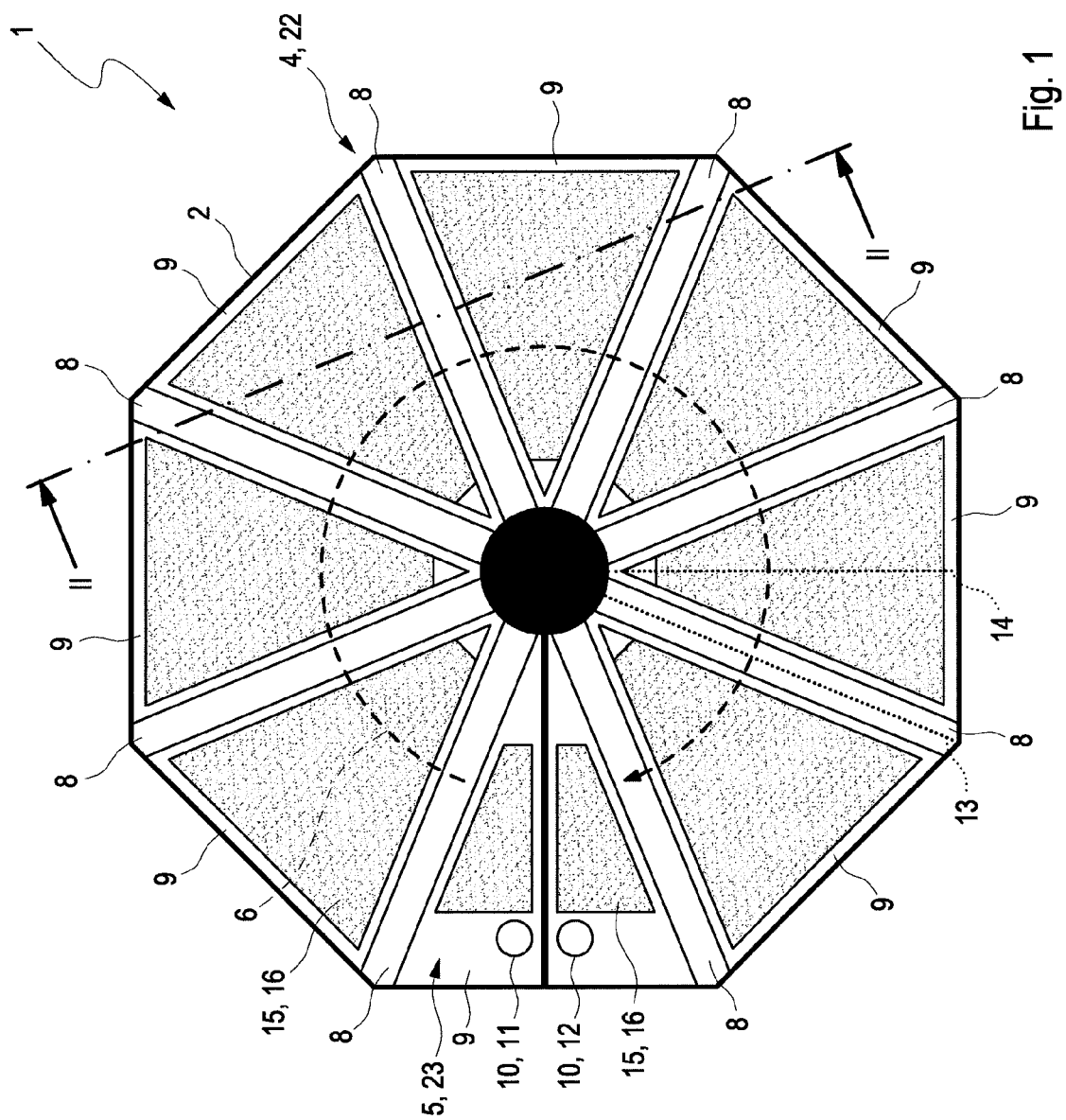
FIG. 1 shows, in a top view, a heat exchanger according to the invention in accordance with a preferred example embodiment, a base of the heat exchanger is removed, in order to expose the view into the interior of the heat exchanger.
Figure 2:
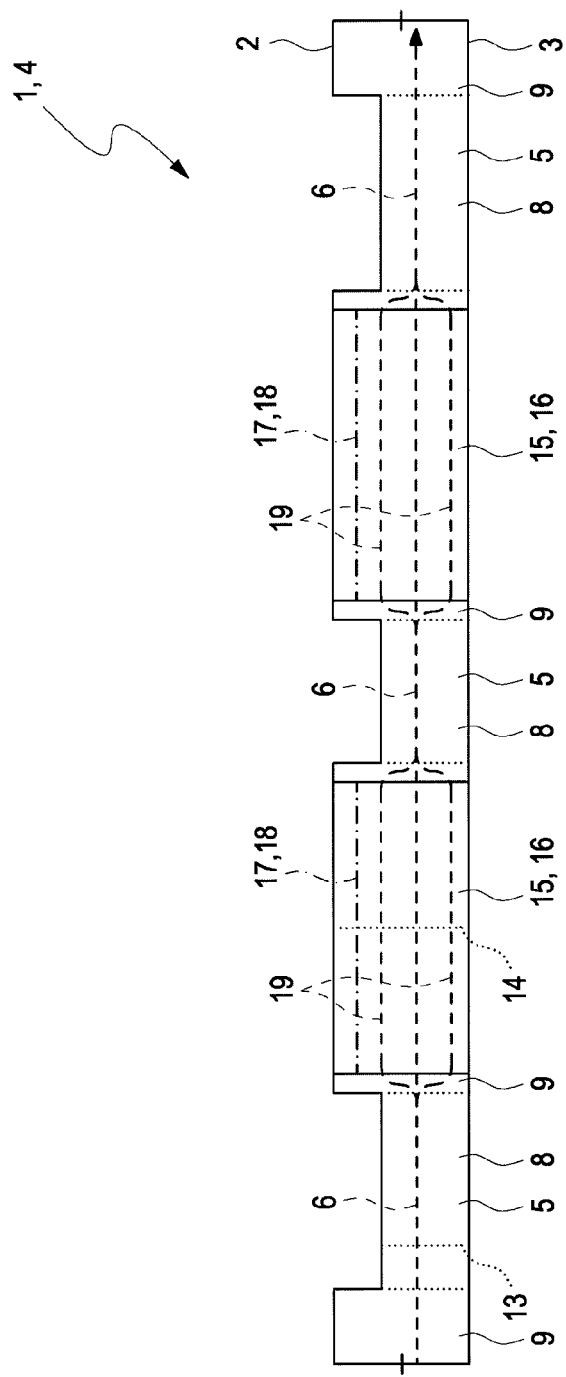
FIG. 2 shows a sectional view of the heat exchanger of FIG. 1 along a section line II-II drawn there.

FIGS. 1 and 2 show a heat exchanger, designated as a whole by the number 1, according to a preferred example embodiment. Such heat exchangers 1 serve typically to dissipate thermal energy from any predetermined system—to be cooled-having a heat source. For this, provision is made here to equip a predetermined system with a heat exchanger 1, which is flowed through by a heat exchanger fluid wherein, on flowing through, thermal energy is transferred from components of the predetermined system to the heat exchanger fluid, in particular through heat conduction. The heat exchanger fluid is expediently a liquid or a gas. The heat exchanger 1 described in the following can be used for example in an inductive charging device 24 of a motor vehicle, in order to provide for sufficient cooling there. Basically, however, other systems can also be specified.

FIG. 1 shows a heat exchanger 1 according to the invention in a top view, wherein the heat exchanger 1 is open on one side in order to expose the view into the interior of the heat exchanger 1. The heat exchanger 1 has two separate one-piece bases 2, 3, see also FIG. 2. For example, the bases 2, 3 are aluminium sheet metal plates. The bases 2, 3 are, by way of example, soldered permanently to one another, so that they as a result on the one hand form or delimit a one-piece heat exchanger housing, designated by the number 4, by way of example a polygonal housing 22, and on the other hand form or delimit a free flow channel 5, by way of example an annular channel 23. A circular flow path 6 for a heat exchanger fluid extends through the flow channel 5. The flow path 6 is roughly indicated by a dashed line in FIG. 1.

The flow channel 5 according to FIGS. 1 and 2 is formed along the flow path 6 by first and second channel passages 8, 9 following one another in an alternating manner in the direction of the flow path 6, which channel passages respectively have a free constant flow cross-section 13, 14 oriented transversely to the flow path 6, and are respectively able to be flowed through by heat exchanger fluid. In FIGS. 1 and 2 the flow cross-sections 13, 14 are indicated respectively only once and respectively by a dotted line. Expediently, the channel passages 8, 9 open downstream and upstream into a channel passage 8, 9 delegated in an adjacent manner directly in the direction of the flow path 6, so that heat exchanger fluid can flow over from the one to the other channel passage 8, 9. It is thus possible that the flow channel 5 is able to be flowed through completely along the flow path 6.

In the top view according to FIG. 1 it can be seen furthermore that the channel passages 8, 9 have, by way of example, respectively approximately a triangular basic shape. They thus give the annular channel 23 and, so to speak also the polygonal housing 22, a polygonal shape. Basically, the heat exchanger 1 or respectively the heat exchanger housing 4 can also be configured in other geometric shapes.

The heat exchanger 1 has further channel passages which are designated here by the number 10) and are named as connection pieces, which are fixed on the heat exchanger housing 4, therefore on one of the two bases 2, 3. By way of example, provision is made that the one connection piece 10 forms a fluid inlet 11 and the other connection piece 10 forms a fluid outlet 12, in order to thereby stream heat exchanger fluid both into and out from the flow channel 5.

The flow cross-sections 13, 14 are selected by way of example so that the flow cross-sections 13 of the first channel passages 8 of the two channel passages 8, 9 are respectively of equal size in terms of area with respect to one another. The flow cross-sections 14 of the second channel passages 9 of the two channel passages 8, 9 are embodied so that they are respectively of equal to size in terms of area with respect to one another. Furthermore, provision is made that flow cross-sections 13 of the first channel passages 8 of the two channel passages 8, 9 are configured smaller in terms of area than the flow cross-sections 14 of the second channel passages 9 of these two channel passages 8, 9. Thus, consequently, two different types of channel passages 8, 9 are defined, namely on the one hand channel passage 8 with relatively small cross-sectional area and, on the other hand, channel passage 9 with relatively large cross-sectional area. The different flow cross-sections 13, 14 of the two channel passages 8, 9 have—expediently assuming a constant volume flow of the heat exchanger fluid—the fluidic effect that the heat exchanger fluid flows through the flow channel 5 at different flow speeds, namely it can flow through the relatively wide second channel passages 8 of relatively large flow cross-section 14 at relatively low flow speed, whereas it flows through the relatively narrow first channel passages 8 of relatively small flow cross-section 13 at comparatively high flow speed. As a whole, this has an influence on the heat transfer behaviour of the heat exchanger 1, expediently on the heat flow which is able to be transferred between a heat source and the heat exchanger fluid. By way of example, the relatively narrow first channel passages 8 of relatively small flow cross-section 13 enable an improved heat dissipation.

Furthermore, in FIGS. 1 and 2 a flow conducting assembly, inserted completely into the flow channel 5 and designated by the number 15, can be seen, which is able to be flowed through completely by the heat exchanger fluid. The flow conducting assembly 15 interacts with the heat exchanger fluid in order to provide a state within the flow channel 5 which is favourable for the heat transfer. By way of example, the flow conducting assembly 15 has several separately formed conducting elements 16, configured respectively in one piece, which in FIG. 1 are indicated respectively by a tapering four-cornered box, and in FIG. 2 respectively by a rectangular box. The conducting elements 16 are inserted by way of example into the second channel passages 9 of the channel passages 8, 9 and are fixed there in a materially bonded manner, namely soldered, on the one and/or other base 2, 3.

Figure 3:
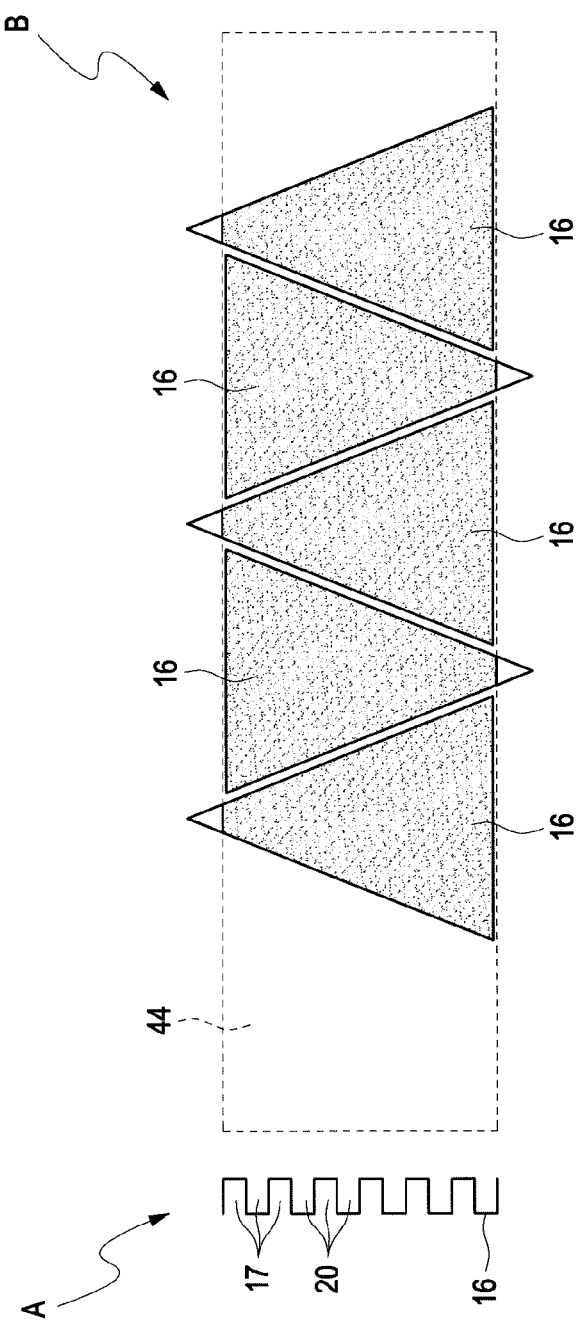
FIG. 3 shows, on the one hand, in a side view designated by the letter A, a single conducting element of a flow conducting assembly of the heat exchanger of FIG. 1, and on the other hand, in a top view designated by the letter B, several conducting elements of the flow conducting assembly of the heat exchanger of FIG. 1 within a production step, and lastly

FIG. 3 shows on the one hand, in a side view designated by the letter A, such a conducting element 16 of the flow conducting assembly 15, and on the other hand, in a top view designated by the letter B, several conducting elements 16 of the flow conducting assembly 15 within a production step. The conducting elements 16 have several conducting channels 17, respectively aligned parallel to one another, see at letter A, which respectively define a channel longitudinal axis 18 along their respective main extent. The conducting channels 17 have respectively a free rectangular conducting cross-section 20, see FIG. 3, and a flow sub-path 19 of the flow path 6 extends through them respectively for the heat exchanger fluid, so that the conducting channels 17 or respectively the conducting elements 16 are able to be flowed through by the heat exchanger fluid. See also FIG. 2; there, by way of example, channel longitudinal axes 18 are recorded by a dot-and-dash line, and several flow sub-paths 19. The said conducting elements 16 are cut to size from a strip material 44 or suchlike expediently within a production step of a production method which is not explained more closely. Here, it is advantageous if the conducting elements 16 are realized as identical parts and in a trapezoidal shape, see FIG. 3 at letter B.

Figure 4:
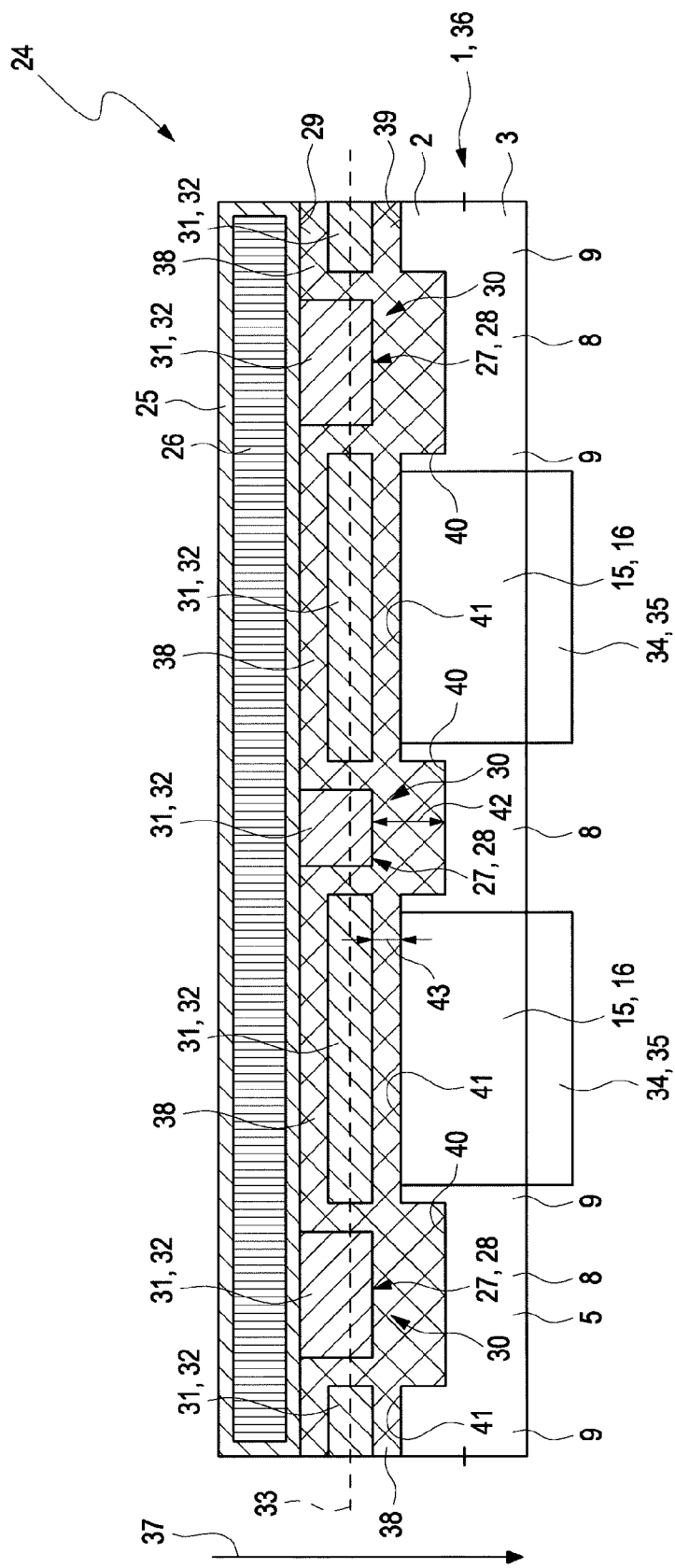
FIG. 4 shows, in a further sectional view, an inductive charging device according to the invention in accordance with a preferred example embodiment with a heat exchanger according to FIGS. 1 to 3.

Finally, FIG. 4 shows a sectional view of an inductive charging device 24 according to the invention, in accordance with a preferred example embodiment, which can be arranged expediently on board a vehicle on the underbody of a motor vehicle, not illustrated, and is a component of a superordinate inductive charging arrangement, not illustrated. Such inductive charging arrangements for motor vehicles in the sense of the present invention consist respectively of the said inductive device 24, able to be installed on board a motor vehicle, and of a mutual inductive device, not illustrated, able to be installed on the roadway. The mutual inductive device is coupled here in a known manner inductively with a coil 26 of the inductive device 24 via a counter coil, not explained more closely, and a pulsing magnetic field provided therewith. Inductive charging arrangements thus permit a traction battery of a motor vehicle to be charged in a contactless manner.

The inductive charging device 24 according to FIG. 4 has a planar coil carrier 25 which forms two opposed carrier large areas, and carries the said coil 26. In order to reinforce the coil carrier 25 and the coil 26 against mechanical force loads, provision is made by way of example that a reinforcing arrangement 26 of several reinforcing bodies 28 is arranged on the coil carrier 25. Expediently, the reinforcing bodies 28 are arranged on a carrier large area 29 of the two carrier large areas and fixed on the coil carrier 25, and spaced apart with respect to one another longitudinally this carrier large area 29, with the formation of free intermediate regions 30. A ferrite body 32 of a ferrite arrangement 31 having several separate ferrite bodies 32 is inserted into each of these intermediate regions 30. Through this arrangement, the ferrite bodies 32 and the reinforcing bodies 28 span a shared plane 33 which, by way of example, is parallel to the carrier large area 29. The plane 33 is indicated in FIG. 4 by a dashed line. The inductive charging device 24 has, furthermore, an electronics arrangement 34 of at least one electronics body 35, for example in order to control and/or regulate the inductive charging device 24. As heat losses occur on or in the components of the inductive device 24 in regular operation of the inductive device 24, which lead to a gradual heating of the inductive device 24, the inductive device 24 is equipped with a cooling element 36 serving for sufficient cooling. By way of example, this cooling element 36 is interposed in a sandwich-like manner, in the direction of a transverse axis 37 standing perpendicularly on the carrier large area 29, between on the one hand the ferrite arrangement 31, the reinforcing arrangement 27 and the coil carrier 25, and on the other hand the electronics arrangement 34. Thereby, both the electronics arrangement 34 can be shielded with respect to the ferrite arrangement 31, the reinforcing arrangement 27 and the coil carrier 25, and also an optimum thermal energy dissipation, i.e. an optimum cooling, can be brought about. The ferrite arrangement 31, the reinforcing arrangement 27, the coil carrier 25 and the cooling element 36 are fixed to one another non-detachably here respectively partially by a hardened casting compound 38 having relatively good thermal conductivity properties.

Expediently, the cooling element 36 is formed by a single heat exchanger 1 according to the preceding description. It is also conceivable that the cooling element 36 is formed by two or more heat exchangers 1, for example in order to increase the total cooling capacity.

According to FIG. 4, provision is made that the entire heat exchanger 1 is fixed on the ferrite arrangement 31, the reinforcing arrangement 27 and the coil carrier 25 by means of the said casting compound 38. Here, the said casting compound 38 covers partially completely a first base 2 of the two bases 2, 3 of the heat exchanger 1; this portion of the base 2 covered by the casting compound 38 is designated here as base large area 39. The latter is parallel with respect to the said carrier large area 29 and the said plane 33.

In the region of the base large area 39, the first base 2 of the two bases 2, 3 has several so-called recesses 40, which could also be designated as recess portions, and several base portions 41. The recesses 40 and the base portions 41 divide the base large area 39 so to speak into alternating successive different regions. The recesses 40 form depressions, so to speak, they point away from the coil carrier 25 in the direction of the transverse axis 37 and are indented with respect to the base large area 39 in the direction of the transverse axis 37 away from the coil carrier 25. According to FIG. 4 it can also be seen that the recesses 40 lie respectively in the direction of the transverse axis 38 opposite one of the said reinforcing bodies 28 of the reinforcing arrangement 27. The base portions 41, on the other hand, are respectively arranged in the direction of the transverse axis 37 lying opposite a ferrite body 32 of the ferrite arrangement 31. Through this configuration, distances 42, 43 of differing size are defined between the heat exchanger 1 and the ferrite arrangement 31, the reinforcing arrangement 27 and the coil carrier 25, namely a first distance 42 in the direction of the transverse axis 37 between a respective recess 40 and the plane 33, and a second distance 43 in the direction of the transverse axis 37 between a respective base portion 41 and the plane 32. Expediently, a first distance 42 is always greater here than a second distance 43. Thereby, the recesses 40 of the first base 2 of the two bases 2, 3, together with the second base 3 of the two bases 2, 3 on which by way of example the electronics arrangement 34 is arranged, can form the first channel passages 8 of the channel passages 8, 9 of the heat exchanger 1. The base portions 41 form together with the second base 3 of the two bases 2, 3 the second channel passages 9 of the channel passages 8, 9 of the heat exchanger 1.

The invention claimed is:

1. A heat exchanger for an inductive charging device of a motor vehicle, comprising:
   two separate bases connected permanently to one another to form a delimit a one-piece heat exchanger housing and a flow channel through which a flow path for a heat exchanger fluid extends;
   the flow channel having, along the flow path, a plurality of channel passages through which the heat exchanger fluid is flowable in succession, the plurality of channel passages each having a free flow cross-section oriented transversely to the flow path;
   the flow cross-sections of a plurality of first channel passages of the plurality of channel passages being flatter than the flow cross-sections of a plurality of second channel passages of the plurality of channel passages; and
   a flow conducting assembly inserted completely into the flow channel, and through which the heat exchanger fluid is flowable, for conducting the heat exchanger fluid; and
   wherein the two separate bases are composed of a metallic material.

2. The heat exchanger according to claim 1, wherein the flow conducting assembly includes a plurality of separate conducting elements that are respectively configured in one piece.

3. The heat exchanger according to claim 2, wherein a single conducting element of the plurality of conducting elements is inserted respectively into at least one of:
   each of the plurality of first channel passages;
   each of the plurality of second channel passages; and
   each of the plurality of first channel passages and the plurality of second channel passages.

4. The heat exchanger according to claim 2, wherein the plurality of conducting elements connected in a heat-conducting manner respectively on at least one of the two separate bases in at least one of a form-fitting manner and a force-fitting manner.

5. The heat exchanger according to claim 2, wherein the plurality of conducting elements are connected in a materially bonded manner respectively on at least one of the two separate bases.

6. The heat exchanger according to claim 2, wherein:
   the plurality of conducting elements each delimit a plurality of conducting channels aligned parallel to one another;
   the plurality of conducting channels each define a respective channel longitudinal axis; and
   a respective flow sub-path of the flow path extends through each of the plurality of conducting channels such that heat exchanger fluid is flowable through each of the plurality of conducting channels.

7. The heat exchanger according to claim 6, wherein the plurality of conducting channels of a respective conducting element of the plurality of conducting elements open at one end and at another end into at least one of a first channel passage of the plurality of first channel passages and a second channel passage of the plurality of second channel passages.

8. The heat exchanger according to claim 6, wherein the plurality of conducting channels of a respective conducting element of the plurality of conducting elements each delimit a free conducting cross-section through which a fluid is flowable, and which is oriented transversely to the respective channel longitudinal axis, is constantly continuous with respect to area, and is rectangular.

9. The heat exchanger according to claim 2, wherein the plurality of conducting elements are at least one of:
  each embodied in a trapezoidal form;
  configured as identical parts and are identical in construction;
  composed of an aluminium material; and
  formed from at least one of a corrugated sheet metal material, a folded sheet metal material, and a pleated sheet metal material.

10. The heat exchanger according to claim 1, wherein:
  the flow cross-sections of the plurality of first channel passages are identical to one another with regard to area; and
  the flow cross-sections of the plurality of second channel passages are identical to one another with regard to area.

11. The heat exchanger according to claim 1, wherein an area of the flow cross-sections of each of the plurality of first channel passages is one of $9/10$, $8/10$, $7/10$, $6/10$, $5/10$, $4/10$, $3/10$, $2/10$, and $1/10$ of an area of the flow cross-section of a second channel passage of the plurality of second channel passages.

12. The heat exchanger according to claim 1, wherein the plurality of first channel passages and the plurality of second channel passages are arranged following one another along the flow path in alternating sequence in turn.

13. The heat exchanger according to claim 1, wherein:
  the heat exchanger housing is at least one of an annular housing and a polygonal housing;
  the flow channel is a planar annular channel;
  the flow path is an annular flow path; and
  the plurality of first channel passages and the plurality of second channel passages are configured respectively with at least one of a circle cut-out shape and a polygon cut-out shape.

14. The heat exchanger according to claim 1, further comprising (i) two connection pieces connected to the heat exchanger housing and (ii) two further channel passages defined by the two connection pieces, wherein;
  a first connection piece of the two connection pieces forms a fluid inlet;
  the other a second connection piece of the two connection pieces forms a fluid outlet;
  heat exchanger fluid is flowable into the flow channel via the fluid inlet; and
  heat exchanger is flowable out from the flow channel via the fluid outlet.

15. An inductive charging device on board a motor vehicle, able to be used in an inductive charging arrangement for charging a traction battery of the motor vehicle, comprising:
  a planar coil carrier installable on a motor vehicle underbody;
  an electrically contactable coil carried by the coil carrier;
  a reinforcing arrangement reinforcing the coil carrier, the reinforcing arrangement including a plurality of reinforcing bodies;
  the plurality of reinforcing bodies arranged on a carrier large area of the coil carrier longitudinally spaced apart from one another defining a plurality of free intermediate regions;
  a ferrite arrangement including a plurality of separate ferrite bodies, a ferrite body of the plurality of ferrite bodies arranged in each of the plurality of intermediate regions;
  the plurality of ferrite bodies and the plurality of reinforcing bodies spanning a plane;
  an electronics arrangement including at least one electronics body;
  a cooling element for cooling the inductive charging device, which, in a direction of a transverse axis extending perpendicularly to the carrier large area, is interposed in a sandwich-like manner between (i) the ferrite arrangement, the reinforcing arrangement, and the coil carrier, and (ii) the electronics arrangement, such that the electronics arrangement is delimited by the cooling element with respect to the ferrite arrangement, the reinforcing arrangement, and the coil carrier and is at least one of shieldable and shielded;
  wherein the ferrite arrangement, the reinforcing arrangement, the coil carrier, and the cooling element are fixed to one another respectively at least partially via a casting compound having heat-conducting properties;
  wherein the cooling element is a heat exchanger according to claim 1;
  wherein a first base of the two separate bases is fixed on the ferrite arrangement, the reinforcing arrangement, and the coil carrier via the casting compound, which completely covers a base large area of the first base; and
  wherein the first base includes a plurality of recesses and a plurality of base portions.

16. The inductive charging device according to claim 15, wherein
  the plurality of recesses and the plurality of base portions are arranged in a region of the base large area and segment the base large area;
  the plurality of recesses:
    point away from the coil carrier in the direction of the transverse axis;
    with respect to the base large area, are indented in the direction of the transverse axis away from the coil carrier; and
    are respectively arranged, in the direction of the transverse axis, opposite a reinforcing body of the plurality of reinforcing bodies;
  the plurality of base portions are respectively arranged, in the direction of the transverse axis, opposite a ferrite body of the plurality of ferrite bodies;
  a first distance in the direction of the transverse axis between a respective recess of the plurality of recesses and the plane is greater than a second distance in the direction of the transverse axis between a respective base portion of the plurality of base portions and the plane.

17. The inductive charging device according to claim 16, wherein:

the plurality of recesses of the first base together with a second base of the two separate bases delimit the plurality of first channel passages; and the plurality of base portions of the first base together with the second base delimit the plurality of second channel passages.

* * * * *